FORWARD BIASED NEGATIVE RESISTANCE SEMICONDUCTOR DEVICES

Filed May 31, 1963

INVENTOR:
NICK HOLONYAK, JR.

BY Julius J. Zaskalicky
HIS ATTORNEY.

3,249,764
Patented May 3, 1966

3,249,764
FORWARD BIASED NEGATIVE RESISTANCE SEMICONDUCTOR DEVICES

Nick Holonyak, Jr., Syracuse, N.Y., assignor to General Electric Company, a corporation of New York Filed May 31, 1963, Ser. No. 284,703
9 Claims. (Cl. 307—88.5)

This invention relates in general to semiconductor devices, and in particular to novel semiconductor devices incorporating semiconductor materials appropriately impregnated with activating materials, proportioned, and arranged to produce novel and useful current flow effects in response to applied radiation, electric and magnetic, and the like stimuli.

Semiconductor materials are materials having a resistivity lying between the resistivities of conductors and insulators. Generally, materials having a resistivity of about .001 ohm centimeter or less are considered conductors. Materials which have a resistivity in excess of about $10^8$ ohm centimeters are considered insulators. Those materials having a resistivity lying in the range of .001 ohm centimeter to $10^8$ ohm centimeters are considered semiconductors. Semiconductor materials having resistivities in excess of about $10^6$ ohm centimeter, that is, lying in the range of $10^6$ to $10^8$ ohm centimeters, are commonly referred to as "semi-insulators."

Semiconductor elements or compounds in their pure state have high resistivities and are referred to as "intrinsic." High purity silicon having a resistivity in excess of 100 ohm centimeters is regarded as approaching intrinsic resistivity. High purity germanium having a resistivity near 50 ohm centimeters is regarded as approaching intrinsic resistivity. High purity gallium arsenide having a resistivity in excess of $10^5$ ohm centimeters is regarded as approaching intrinsic.

The resistivity of elemental and compound semiconductors may be changed by the introduction thereinto of impurities, commonly referred to as "activators" or "dopants." Activators are at least of two types, N-type conductivity inducing or P-type conductivity inducing, the former being referred to as "donors" and the latter as "acceptors." The presence of donor activator produces an excess of free electrons in the semiconductor material in proportion to their number and lowers the resistivity thereof. The presence of acceptor produces an excess of holes or a defect of electrons in the semiconductor and also lowers the resistivity thereof. In elemental semiconductor materials such as germanium and silicon of Group IV of the Periodic Table of Elements small quantities of the elements of Group V of the Periodic Table are donors as they introduce an excess of electrons and elements of Group III are acceptors as they introduce an excess of holes or produce a defect of electrons. When both donor and acceptor activators are present in a semiconductor material, the resistivity of the material may also be very high as one impurity compensates or neutralizes the other.

When an activator is introduced into a semiconductor material, it produces energy levels or states in the forbidden band between the valence and conduction bands of the material. When the activator is an element of Group V of the Periodic Table of Elements, such as arsenic, phosphorus and antimony, and the semiconductor is germanium or silicon, energy levels are produced adjacent the conduction band of the semiconductor and referred to as shallow donor levels. The electrons of these levels are easily ionized at room temperatures into the conduction band where they function in carrying out electrical conduction in the material. When the activator is an element of Group III of the Periodic Table of Elements, such as indium, aluminum, gallium and boron, and the semiconductor is germanium or silicon, energy levels are produced adjacent the valence band of the semiconductor and are also referred to as shallow acceptor levels. Electrons in the valence band are also easily energized at room temperatures into these levels, thereby making available holes or defects of electrons therein wherein they function in carrying out electrical conduction in the material.

Elements from groups in the Periodic Table of Elements other than Groups III and V, such as gold, copper, cobalt, zinc, iron, nickel and manganese when introduced into semiconductor materials such as germanium, silicon (and gallium arsenide) produce energy levels which lie deep in the forbidden band of the material from which and to which electrons are not easily ionized at room temperatures. Accordingly such activators have minimal influence on the usual conduction processes in the conduction and valence bands of the material. However, such activators producing deep lying levels may have a neutralizing effect on activators producing shallow levels, by tying up electrons normally available in the conduction (and valence) band. Semiconductor materials, such as germanium, silicon and gallium arsenide, when impregnated with proper ones and quantities of activators producing deep lying and shallow levels, properly proportioned, and appropriately coupled to an exciting source, are capable of exhibiting novel and useful electrical effects to be described below.

Elemental semiconductor materials, such as silicon and germanium, and Group III–Group V compound materials, such as gallium arsenide, appropriately doped with impurities have been used in a variety of asymmetrically conductive devices. One type of such device known to those skilled in the art is commercially referred to as a PIN diode. Such device comprises a body of semiconductor material having a region of low resistivity P-type conductivity, another region of low resistivity N-type conductivity and an intermediate region of high or intrinsic resistivity contiguous with an spaced between said other regions.

When the P-type region is polarized negatively with respect to the N-type region, a high impedance is presented between the P-type and N-type regions to the flow of current therethrough as no appreciable carriers, either electrons or holes, are available in the intermediate region for conduction therethrough. Conversely, when the P-type region is made positive wth respect to the N-type region, the device readily conducts in the forward direction. Under the latter conditions electrons are injected from the N-type region into the intrinsic region and diffuse toward the P-type regions and holes are injected from the P-type region into the intrinsic region and diffuse toward the N-type region. The electrons and holes recombine in the intermediate region whereby a low impedance is presented between the P-type and N-type regions to the flow of current therebetween. In this device the distance between the P-type and N-type regions is smaller than the diffusion lengths of the electron and hole carriers in the intermediate region of the semiconductor material. Diffusion length refers to the distance one type of carrier travels on the average before it recombines with an opposite type carrier. If the diffusion lengths of the carriers are sufficiently short in comparison to the distance between the P-type and N-type conductivity regions of the device such that recombination does not occur, broadly over the intermediate region, the device would not have low resistance in the forward bias direction.

I have found that an asymmetrically conductive device of the general construction outlined above can be made to behave so as to produce a variation of current which increases with decreasing voltage in the forward bias direction thereof. This negative resistance characteristic is brought about by making certain modifications in the composition and arrangement of the materials of the device. One modification consists of impregnating the intrinsic resistivity region with a certain background concentration of shallow donors and with activators having deep lying energy levels or states, such as gold, copper, cobalt, zinc, iron, nickel and manganese in sufficient quantity to move the resistivity of the material into the region of resistivities, i.e. $10^5$ to $10^8$ ohm centimeters, normally regarded as semi-insulating at normal ambient temperatures. The other modification consists of arranging the spacing of the P-type and N-type regions of the device to be greater than the diffusion length of holes in the semi-insulating material for the condition of low current injection of holes into the semi-insulating material such that a high impedance is presented between the P and N type regions at such currents.

When a low voltage is applied in the forward direction to such a device, both electrons and holes are injected into the semi-insulating material. Because of the presence of the deep-lying levels in the semi-conductor material, holes are prevented from moving appreciably in the direction of the N-type region and lowering the resistivity of the intrinsic resistivity intermediate region. In effect, the deep-lying levels act as recombination centers at low injection levels and reduce considerably the lifetime of such injected holes. The lifetime of holes at low injection levels varies according to the following relationship:

$$\tau_{p\,(low)} \approx \frac{1}{\overline{V}_p \sigma_p N_R}$$

where $\tau_{p(low)}$ is low injection level hole lifetime, $\overline{V}_p$ is thermal velocity of holes, $\overline{\sigma}_p$ is the capture cross-section for holes, and $N_R$ is the number of acceptor levels. The injected electrons repopulate the deep levels depopulated by the injected holes at low level injection. With increasing voltage, current flow through the device increases as the recombination centers tend to become flooded and as injected electrons inhibit the further injection of electrons into the material. At a certain value of voltage, the high resistivity region is flooded with holes and the recombination centers are overwhelmed. As a result the lifetime of holes in the high resistivity region is increased and holes injected into that region now tend to act as they would in a conventional PIN device. When this condition is reached, the resistance of the high resistance intermediate region drops very rapidly, permitting current to increase with decreasing voltage until a voltage is reached at which the current increases with an increase in voltage. The lifetime of holes (and electrons) at high injection level varies according to the following relationship:

$$\tau_{p(high)} \approx \frac{1}{\overline{v}_p \sigma_n N_R} \approx \tau_{n(high)}$$

where $\tau_{p(high)}$ is the high injection level lifetime of holes, $\tau_{n(high)}$ is the high level of lifetime of electrons, and $\sigma_n$ is the capture cross-section for electrons.

Accordingly, it is seen that a graph of the current versus voltage relationship for such device has three segments, a first segment lying in a low current range in which the current increases with voltage, a second segment in the medium current range in which the current increases with decreasing voltage, and a third segment in the high current range in which the current increases with an increase in voltage. The first segment of the current versus voltage graph results in the main from space charge limited phenomena, and accordingly, as expected, the current in general increases nearly as the square of the applied voltage. The second segment results from the transition from a basically stable space charge limited mode of operation to a generally forward biased unstable semiconductor mode of operation, and accordingly as expected, the increase of current with decrease of voltage takes place at a rapid rate. The third segment results from the generally stable forward biased semiconductor mode of operation, and accordingly, as expected, the increase of current with increase of applied voltage occurs at a rapid rate. The general outlines of one theory which is believed to explain the current versus voltage response of such devices is set forth in detail in an article in the Physical Review, Volume 125, No. 1, pages 126–141, January 1962, entitled, "Double Injection in Insulators" by Murray A. Lampert.

On the one hand the number of atoms of a deep level dopant which can be introduced into a semiconductor is limited by the solubility of the dopant in the semiconductor material. On the other hand if an insufficient number of atoms of a deep level dopant are introduced the resistivity of the material is not sufficiently high (i.e. the life-time reducing effects for holes is inadequate), accordingly the arrangement doesn't behave in the mode explained. In general I have found that concentrations of deep level dopants typically in excess of the order of $10^{15}$ atoms per cubic centimeter enable the device to behave in the mode explained. Concentrations of deep level impurities in the range of $10^{14}$ to $10^{17}$, in general have been found suitable to produce the mode of operation described as well as other effects to be described below. The upper limit, of course, is the solid solubility of the dopant in the semiconductor. With dopants which introduce a plurality of effective levels the concentration limits would be different than for those dopants which introduce just a single effective level.

I have found that current flow in the kind of device described in the preceding paragraphs in the space charge limited and negative resistance modes of operation thereof, can be made responsive to the application of energy thereto in various forms including electromagnetic wave energy such as light. Such response is obtained by utilization of particular deep level producing activators and concentrations thereof falling within a certain range. While the reason for such current flow behavior is not fully understood, it is believed that incident radiation empties the deep-lying levels of electrons, thereby influencing the lifetime reducing effects of these levels and as well making electrons available in the conduction band to carry out the conduction process. The time of response is very rapid making such structures useful for a variety of applications. I have found that field strengths of the order $10^3$ to $10^4$ volts per centimeter are sufficient to produce the behavior described. Such devices are highly useful as detectors of radiation as will be described below.

With low concentrations of deep level inducing activators and in particular with a material such as germanium switching takes place to very low forward voltage. However, I have further found that when particular semiconductors including deep level producing activators in a predetermined range of concentrations are employed, the voltage in the third segment portion of the voltage current graph does not fall to a low value generally consistent with the forward biased modus operandi of a PIN type of semiconductor device, or in accordance with the theory set forth in the above mentioned article, but to a value intermediate that value and the peak value thereof and also that in certain cases imperceptible increases in voltage causes currents to increase to very great magnitudes. While I do not want to be bound by my explanation as to the behavior of such structures at high concentrations of deep level inducing activators I believe that the relationship of current response as a function of incident radiation and voltage is related in a complex way with the concentration of such activators.

Zener diodes are commonly used to perform a voltage reference function in the low voltage ranges. Such devices comprise a body of semiconductor material having a P-type conductivity and an N-type conductivity region meeting in a P-N junction. When a voltage in excess of a particular voltage is applied between said regions so as to reversely bias the P-N junction, the fields in the P-N junction region at that voltage are sufficient to cause the semiconductor material of the device to break-down, i.e., for the atoms of the material to become ionized by an avalanche process similar to the avalanche ionization of gaseous media and conduct current. The current in such devices at that particular voltage increases virtually without limit with but imperceptible change in voltage across the device. Such devices can be designed to have a particular voltage breakdown over a wide range of voltages by the proportioning of the device and more particularly by control of the concentrations of impurities in the P-type and N-type conductivity regions thereof. With increasing concentration of impurities the breakdown voltage is lowered; however, a limit is reached with respect to the concentration of impurities that can be introduced on the basis of the chemical properties of the material and also more so on the basis of the modus operandi of the resultant heavily doped semiconductor material. Such a point in silicon is reached at a very low voltage of the order of 6 to 8 volts where the avalanche effect is no longer the dominant effect but the Zener of tunneling effect becomes appreciablle. With the latter principle influencing the mode of operation of the device the voltage breakdown characteristic is not clearly defined and abrupt at a definite voltage but rather rounded or "soft." I have found that the constant voltage level of the device in accordance with my invention can be varied for a particular semiconductor by appropriately dimensioning the material and by altering the kind and quantity of deep level inducing activators. While I do not want to be bound by my explanation as to the reasons for such specific characteristics in such devices in accordance with my invention I believe the reasons to be akin to the reasons for the display of such current versus voltage characteristics in gaseous discharge voltage reference devices.

Accordingly, it is an object of the present invention to provide novel semiconductor devices.

It is an object of the present invention to provide an improved energy responsive semiconductor device.

It is an object of the present invention to provide a radiation responsive semiconductor device of high sensitivity.

It is an object of the present invention to provide a radiation responsive semiconductor device which develops large currents in response to incident radiation.

It is an object of the present invention to provide a radiation and voltage responsive device which has fast turn on and turn off response.

It is an object of the present invention to provide semiconductor devices responsive to a range of wave lengths of radiation at room temperatures with high sensitivity.

It is an object of the present invention to provide a two electrode forward biased radiation responsive semiconductor device of high sensitivity for radiation having wavelengths extending over a broad range of wavelengths.

It is an object of the present invention to provide a semiconductor device which switches from a high to a low impedance state in response to applied radiation of various intensities alterable over a wide range of intensities.

It is an object of the present invention to provide a two terminal semiconductor device having a current versus voltage characteristic responsive to applied energy singly or in combination in the form of electromagnetic radiation, electric fields, atomic particles and the like, thereby rendering the device uniquely suitable to perform a variety of transduction functions.

It is an object of the present invention to provide a semiconductor device having in the current versus voltage characteristic in the forward conduction direction a segment in which the current increases with decreasing voltage in a variety of semiconductor materials and in a variety of forms.

It is an object of the present invention to provide a semiconductor diode having a current versus voltage response which may be varied from one extreme in which a segment thereof has a pronounced negative resistance to the other extreme where the characteristic is generally in accord with the forward characteristic of a P-N rectifying junction.

It is an object of the present invention to provide an improved semiconductor constant voltage reference device.

It is an object of the present invention to provide a voltage reference semiconductor device which can maintain a constant voltage to very close tolerances over a wide range of currents.

It is an object of the present invention to provide a voltage reference semiconductor device for use at very low voltages.

The novel features believed to be characteristic of my invention are set forth in the appended claims. The invention itself however, together with further objects and advantages thereof, may best be understood by reference to the following disclosure taken in connection with the accompanying drawings, in which:

Figure 1:
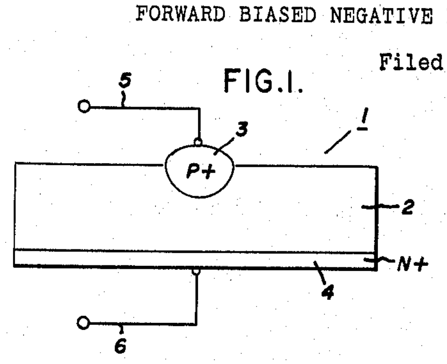
FIGURE 1 shows a side view of a germanium semiconductor diode device in accordance with the present invention.

Referring now to FIGURE 1 there is shown a diode 1 comprising a wafer 2 of high resistivity relatively semi-insulating germanium semiconductor material into one side of which is alloyed a quantity of material such as gallium-doped indium to provide a heavily doped P-type conductivity region 3 and into the other side of which is alloyed a layer of material such as gold doped with antimony to provide a heavily-doped N-type conductivity region 4. The germanium wafer may be, for example, N-type germanium counter-doped with about $10^{16}$ to $10^{17}$ atoms per cubic centimeter of copper to render the material virtually semi-insulating. Electrodes 5 and 6 are conductively connected to regions 3 and 4, respectively. The wafer has major dimensions 50 x 50 mils (a mil is one thousandth of an inch). Spacing between P-type and N-type regions is 12 mils.

Figure 2:
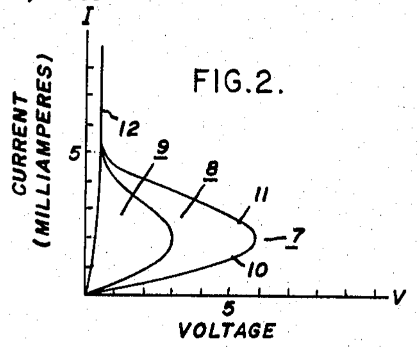
FIGURE 2 shows graphs of current versus voltage for the device of FIGURE 1 useful in exploring the operation thereof.

FIGURE 2 shows graphs of current for forward voltages applied between the electrodes 5 and 6 of the device of FIGURE 1. Graph 7 shows the current-voltage relationship in normal ambient room light (300° K.). Graph 8 shows the current-voltage relationship when light of higher intensity is applied to the device, and graph 9 shows the current-voltage relationship when a still higher level of light is applied to the device.

As explained above graph 7 has three segments, a segment generally space charge limited 10, a negative resistance segment 11, and a relatively flat segment 12 more or less like the forward characteristic of a conventional P-N junction device. As mentioned above when sufficient radiation in the form of light is applied to the device, the negative resistance segment disappears from the current versus voltage relationship as seen in graph 9.

Other devices of the type shown in FIGURE 1 have been fabricated with N-type germanium impregnated with sufficient concentrations of one of the deep level forming materials, gold, cobalt, iron, nickel, manganese and zinc in accordance with the description above. In general, these devices had current-voltage relationship and responded to light in a manner similar to the manner in which the device of FIGURE 1 responded to light.

The sensitivity of the current at particular voltages in the space charge limited region mode of operation of the device of FIGURE 1 to light level makes the device of FIGURE 1 particularly suitable as the light responsive element in four-terminal amplifying devices. Also, in view of the negative resistance characteristic of the device of FIGURE 1, it would be suitable for use in four-terminal switching devices in which a two-terminal output circuit is switched from a high resistance state to a low resistance state in response to light generated by a two-terminal input signal.

Figure 3:
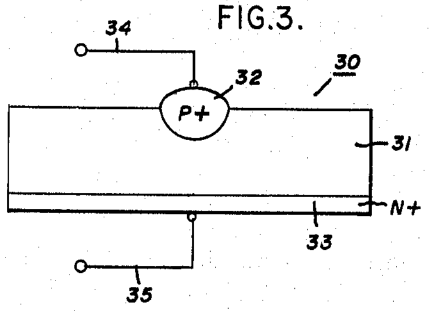
FIGURE 3 shows a side view of a silicon semiconductor diode device in accordance with the present invention.

FIGURE 3 shows another photoresponsive double injection diode 30 comprising a wafer 31 of silicon semi-insulating material into one side of which is alloyed a quantity of material such as aluminum to provide a heavily-doped P-type conductivity region 32 and into the other side of which is alloyed a layer of a material such as gold-doped antimony to provide a heavily-doped N-type conductivity region 33. Conductive connections 34 and 35 are made to regions 32 and 33, respectively. The silicon wafer was obtained from an ingot of silicon of N-type conductivity, which was counter-doped with gold to a final resistivity of about $10^5$ ohm-cms. The wafer had the dimensions of 50 mils by 50 mils. The spacing between the P-type and N-type regions was less than 10 mils. It is estimated that the concentration of gold atoms in the semi-insulating portion of the silicon wafer was of the order of $10^{15}$ to $10^{17}$ atoms per cubic centimeter.

Figure 4:
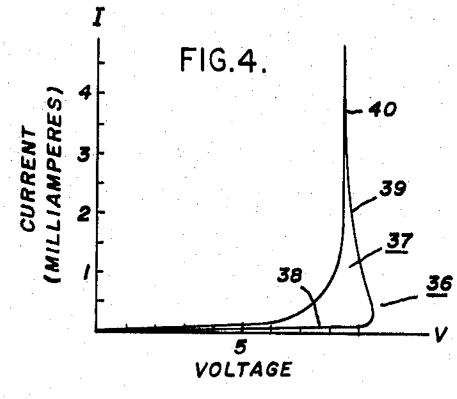
FIGURE 4 shows graphs of the current versus voltage characteristics for the device of FIGURE 3 useful in explaining the operation thereof.

FIGURE 4 shows graphs of current for forward voltages applied between electrodes 34 and 35 of the device of FIGURE 3 at room temperature (300° K.). Graph 36 shows the current-voltage relationship in normal ambient room light. Graph 37 shows the current-voltage relationship when the device is illuminated. As explained in connection with the device of FIGURE 1, graph 36 has three segments, a generally space charge limited segment 38, a negative resistance segment 39 in which the current increases with decreasing voltage, and relatively flat segment 40. As in connection with the device of FIGURE 1, when sufficient light is applied thereto, the negative resistance segment disappears from the graph as evident in graph 37.

Other devices of the kind shown in FIGURE 3 were fabricated from 100 ohm-cm. N-type conducivity silicon into which cobalt had been diffused for two weeks. In such devices the third segment of the current voltage graph corresponded to the forward characteristic of a conventional silicon rectifier, i.e., it was at a much lower level of voltage than the gold-doped silicon and the current varied with voltage much as the forward current in a conventional P-N junction diode. It is estimated that cobalt was present in concentrations of less than $10^{15}$ atoms per cubic centimeters. The dimensions and spacings of the region of the wafer were as mentioned above in connection with FIGURE 3.

Figure 5:
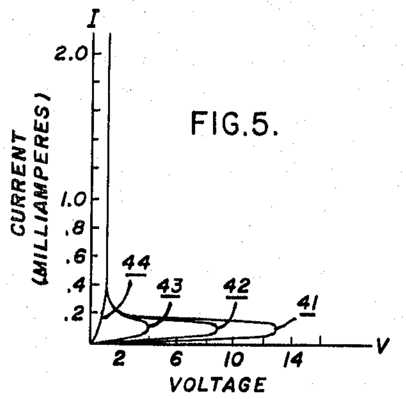
FIGURE 5 shows graphs of the current versus voltage characteristics for modifications in the device of FIGURE 3 in accordance with the present invention.

FIGURE 5 shows graphs of such cobalt-doped device for various levels of illumination. Graph 41 shows the current versus voltage characteristic in room light. Graph 42 shows the variation of current versus voltage characteristic when the device was illuminated slightly with a microscope lamp. Graph 43 shows the current versus voltage characteristic with applied illumination greater than for the graph 42. Graph 44 shows the current versus voltage characteristic of the device when flooded with light.

Other devices of the kind shown in FIGURE 3 were also fabricated from N-type silicon of .25 ohm-cm. resistivity which had been impregnated with about $2\times10^{16}$ atoms/cm.$^3$ of zinc. The current-voltage graphs of these devices were similar to the graphs of FIGURE 5. The zinc-impregnated silicon switched down to more or less the normal forward voltage versus current characteristic of a conventional P–N junction diode. However, the currents of the devices were much more sensitive to variations in light level applied to the device than in the case of the gold-doped devices.

Figure 6:
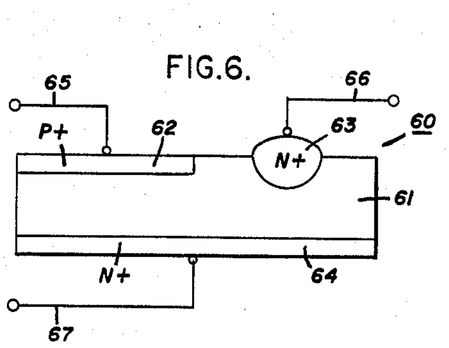
FIGURE 6 shows a side view of a gallium arsenide semiconductor device in accordance with the present invention.

In FIGURE 6 is shown another semiconductor device 60 in accordance with the present invention. The device comprises a wafer 61 of semi-insulating gallium arsenide having a heavily impregnated P-type region 62 adjacent one surface thereof, a heavily impregnated N-type region 63 adjacent the same surface thereof spaced from the P-type region 62, and another heavily impregnated N-type region 64 in the opposite surface of the wafer. Conductive electrical connections 65, 66 and 67 are provided to the P-type region 62, the N-type region 63 and the N-type region 64, respectively.

The device of FIGURE 6 may be made by starting with a wafer of commercial grade semi-insulating gallium arsenide. The dimensions may conveniently be 50 mils x 50 mils x 15 mils. Zinc is diffused into one surface of the wafer in a closed tube to convert a thin surface of the wafer 1 mil deep into heavily doped P-type conductivity. The heavily impregnated N-type regions are formed by fusing tin thereto. Tin is also used to make ohmic connection generally indicated by 65 to the heavily impregnated P-type region 62 by forming a tunnel junction therewith. With the P-type region 62 positively biased for injection, the tunnel junction would be reversely biased, have low impedance and thus serve as an ohmic contact. The spacing of the P-type region 62 from the N-type regions 64 and 63 was less than 15 mils and greater than 2 mils.

Presumably, the commercial grade gallium arsenide wafer used has defects and deep levels arising from impurities which render the wafer semi-insulating. The donor atoms present produce energy levels which lie near the conduction band thereof. Acceptor-like atoms present produce energy levels which lie deep in the forbidden band of gallium arsenide. It is thought that oxygen is the prime impurity responsible for semi-insulating gallium arsenide. The resistivity of semi-insulating gallium-arsenide may exceed $10^6$ ohm-cms.

Figure 7:
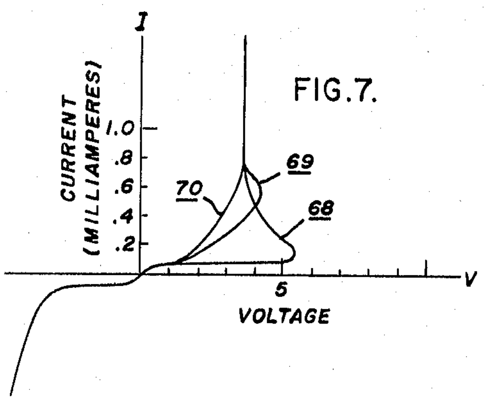
FIGURE 7 shows graphs of current versus voltage characteristics for the device of FIGURE 6 in accordance with the present invention.

FIGURE 7 shows graphs of the variation of current flow between electrode 65 and 66 in response to forward voltage applied therebetween to cause double injection at three different light levels. Graph 68 shows current versus voltage characteristic at normal room light. The current increases with voltage generally in proportion to the square of voltage until a critical voltage is reached corresponding to the peak of the graph at which condition the current increases with decreasing voltage until a predetermined value of voltage is reached. From that point the current increases rapidly with a very small increment of voltage. Graph 69 shows the current versus voltage characteristic when the device is illuminated with a microscopic lamp. Graph 69 similarly has the three segments described in connection with graph 68, however, the peak occurs at a lower voltage and considerably higher current and the negative resistance segment is of smaller extent in voltage and current. Graph 70 shows the current versus voltage of the device when flooded with light.

The current versus voltage characteristic of the device of FIGURE 6 between contact 65 and contact 66 may be shifted by the application of a magnetic field thereto. With a magnetic field having a field strength of 5000 Gauss oriented to deflect hole current deeper into the wafer 71 and for a constant level of ambient light the entire current versus voltage graph shifts along the voltage coordinate to higher voltages, roughly double those with no applied magnetic field. A somewhat lesser shift is observed with a reversely directed magnetic field. In both cases the shape and proportions of the current versus voltage characteristic are relatively unaffected. Accordingly, it is apparent that in addition to voltage and radiation, magnetic fields may be used in devices such as described to alter the current response as desired.

The light-to-current transducer device of FIGURE 6 would be suitable as the output member of a light coupled device, the input member of which is a current-to-light transducer. Such a device could be operated in the region of the current versus voltage characteristic of the device which is generally space charge limited.

It will be appreciated that other deep-level inducing impurities such as copper may be used to form the intermediate semi-insulating region of the gallium arsenide devices. Also, it is noted that the same kind of current versus voltage response is obtained for voltages applied between electrodes 65 and 67 as for the current versus voltage response between electrodes 65 and 66.

My invention has been described and illustrated in a number of embodiments in germanium, silicon and gallium arsenide semi-insulating materials. In general germanium semiconductor material which had been compensated to a resistivity of 20 ohm centimeters or greater was quite suitable for a number of applications. Even a resistivity of 10 ohm centimeters has been found suitable for certain applications. In silicon resistivities as low as 100 ohm centimeters have been found quite suitable for most applications. In gallium arsenide resistivities of the order of $10^5$ to $10^6$ ohm centimeters have been used.

In germanium copper, iron, nickel, cobalt, zinc and manganese have been found to be suitable deep-level inducing dopants. In germanium iron has been found to introduce into the germanium material deep levels giving the best light sensitivity. Copper in germanium has the highest solubility and accordingly would give the greatest flexibility in meeting specific device requirements. In silicon the aforementioned materials used in connection with germanium are also quite suitable. Gold appears to be the best of the dopants because of its high solubility in silicon thereby making it possible for compensation over wide ranges to provide devices having a wide range of responses. Cobalt and zinc are also quite suitable as deep level dopants in silicon for reasons apparent in the foregoing description among which are its light sensitivity properties. In gallium arsenide zinc and copper have been found to be suitable deep level dopants.

In the case of certain deep-level dopants such as gold, copper, zinc, iron and cobalt which introduce several deep lying levels at various voltages in the band gap less of such material need be included in the semiconductor to compensate for the levels introduced by donors to render the material semi-insulating than for those materials which introduce just a single effective deep level. With regard to the spacing of the hole and injecting electron contacts, in the case of germanium devices, spacings between 2 mils and 10 mils have been found quite satisfactory. In the case of silicon spacing of these magnitudes have also been found to be quite satisfactory. In gallium arsenide the spacing was found to be least critical and has ranged from as low as 2 mils to over 20 mils.

The voltage at which the device switches from the generally spaced charge limited mode of operation into the negative resistance mode of operation, i.e., the peak or threshold voltage is a function of the semiconductor material, the character and concentration of deep level dopants therein, the minority carrier life-time therein, and the spacing between the hole and electron injecting contacts. I have found that field strengths roughly in the range $10^3$ to $10^4$ volts per centimeter have been sufficient to cause the device to attain the threshold voltage. Of course, the voltage level to which the device switches depends upon the concentration of deep level dopants as pointed out in the preceeding paragraphs as also does voltage level of the third segment of the current versus voltage characteristic.

Silicon devices have been made having a threshold voltage ranging from about a volt to 20 volts. Germanium devices have been made having threshold voltages varying from 1 volt to 100 volts. Gallium arsenide devices have been made having threshold voltages varying from less than 1 volt to over 200 volts.

Devices have been made in accordance with my invention which are able to pass currents as high as 100 milliamperes. With high currents heating is produced in the semiconductor material and cause ionization effects which may undesirably alter the characteristics of the device, and hence to be avoided.

As the devices in accordance with my invention involve charge storage which may be altered by the application of radiation thereto such devices are capable of fast recovery under such circumstances.

While I have shown and described specific embodiments in accordance with my invention, it will, of course, be understood that various modifications may be devised by those skilled in the art which will employ the principles of the invention and found in the true spirit and scope thereof.

What I claim as new and desire to secure by Letters Patent of the United States is:

1. A semiconductor device that exhibits negative resistance in the forward biased direction comprising a body of semiconductor material, said semiconductor material being impregnated with an activator forming a donor level therein adjacent the conduction band thereof, said semiconductor material being impregnated with another activator material forming an acceptor level therein lying deep in the forbidden band thereof, said other activator being present in a concentration of about $10^{15}$ to $10^{17}$ atoms per cubic centimeter sufficient to render said body virtually semi-insulating, a contact to said body for introducing holes therein, another contact to said body for introducing electrons therein, said one contact being spaced from said other contact by a distance larger than the diffusion length for holes in said resultant material at low level hole injection into said body.

2. A radiation responsive device comprising a body of semiconductor material, said semiconductor material being impregnated with an activator forming a donor level therein adjacent the conduction band thereof, said semiconductor material being impregnated with another activator material forming an acceptor level therein lying deep in the forbidden band thereof, said other activator being present in concentrations of the order of $10^{15}$ to $10^{17}$ atoms per cubic centimeter and sufficient to render said body virtually semi-insulating, a contact to said body for introducing holes therein, another contact to said body for introducing electrons therein, said one contact being spaced from said other contact by a distance larger than the diffusion length for holes at low level injection.

3. A radiation responsive device comprising a body of gallium arsenide semiconductor material, said semiconductor material being impregnated with an activator forming a donor level therein adjacent the conduction band thereof, said semiconductor material being impregnated with other activator material forming an acceptor level therein lying deep in the forbidden band thereof, said other activator being present in concentration of about $10^{15}$ atoms per cubic centimeter sufficient in relation to said donor activator to render the resistivity of said body of the order of $10^5$ ohm-centimeters at normal ambient temperatures, a contact to said body for introducing holes therein, another contact to said body for introducing electrons therein, said one contact being spaced from said other contact by a distance larger than the diffusion length for holes in said resultant material at low level injection.

4. A radiation responsive device comprising a body of silicon semiconductor material, said semiconductor material being impregnated with an activator forming a donor level therein adjacent the conduction band thereof, said semiconductor material being impregnated with other activator material forming an acceptor level therein lying deep in the forbidden band thereof, said other activator being present in concentrations in relation to said donor activator sufficient to render the resistivity of said body in excess of 100 ohm centimeters at normal ambient temperatures, a contact to said body for introducing holes therein, another contact to said body for introducing electrons therein, said one contact being spaced from said other contact by a distance of from 2 to 30 mils.

5. A negative resistance device comprising a body of semiconductor material, said semiconductor material being impregnated with an activator forming a donor level therein adjacent the conduction band thereof, said semiconductor material being impregnated with another activator material forming an acceptor level therein lying in the vicinity of the center of the forbidden band thereof, said other activator being present in concentrations sufficient to render said body virtually semi-insulating at room temperatures, a contact to said body for introducing holes therein, another contact to said body for introducing electrons therein, said one contact being spaced from said other contact by a distance larger than the diffusion length for holes at low current level injection and smaller than said diffusion length for high current level injection for holes, and means for applying a voltage between said contacts to permit holes to be injected into said body from said one contact and electrons to be injected into said body from said other contact, whereby initially the current flow between said contacts increases gradually with large increases in voltage until a peak voltage is reached at which the current increases rapidly with decreasing voltage until a valley voltage is reached at which the current increases faster than further increases in voltage.

6. A constant voltage reference device comprising a body of semiconductor material, said semiconductor material being impregnated with an activator forming a donor level therein adjacent the conduction band thereof, said semiconductor material being impregnated with another activator material forming an acceptor level therein lying deep in the forbidden band thereof, said other activator material being present in concentrations in the range of $10^{15}$ to $10^{17}$ atoms per cubic centimeter sufficient to render said body virtually semi-insulating, a region of p-type conductivity in one portion of said body, a region of N-type conductivity in another portion of said body, said P-type region being separated from said N-type region by a distance larger than the diffusion length for holes at low current level injection, and contacts to said p-type region and said N-type region to permit forward biasing thereof.

7. A constant voltage reference device comprising a body of silicon semiconductor material, said semiconductor material being impregnated with an activator forming a donor level therein adjacent the conduction band thereof, said semiconductor material being impregnated with another activator material forming acceptor levels therein lying deep in the forbidden band thereof, said other activator material being gold and present in concentrations in the range of from about $10^{15}$ to $10^{17}$ atoms per cubic centimeter therein sufficient to render said body virtually semi-insulating, a region of P-type conductivity in one portion of said body, a region of N-type conductivity in another portion of said body, said P-type region being separated from said N-type region by a distance larger than the diffusion length for holes at low current level injection and smaller than said diffusion length for high current level injection for holes, and means for forward biasing said P-type region with respect to said N-type region to make a value to cause high level current injection therein.

8. A semiconductor device that exhibits negative resistance in the forward biased direction comprising a body of semiconductor material, said semiconductor material being impregnated with an activator material of the group consisting of gold, copper, zinc, cobalt, iron, manganese, and nickel forming acceptor levels therein lying in the central region of the forbidden band thereof, said activator being present in a concentration of about $10^{15}$ to $10^{17}$ atoms per cubic centimeter sufficient to render said body relatively semi-insulating with a resistivity of about $10^5$ to $10^8$ ohm centimeters, whereby said levels provide recombination centers for charge carriers at low injection current levels, a P conductivity type region contiguous with one portion of said body for introducing holes therein, an N conductivity type region contiguous to another portion of said body for introducing electrons therein, said P conductivity type region being spaced from said N conductivity type region by a distance larger than the low injection level lifetime diffusion length for holes therein.

9. A double injection diode capable of exhibiting negative resistance characteristics to injection current in the range of current greater than space charge limited current therethrough comprising a body of single crystal semi-insulating semiconductor material having a resistivity of about $10^6$ ohm centimeters at room temperature, means for injecting P-type charge carriers into one portion of said body, means for injecting P-type charge carriers into another portion of said body spaced from said one portion by a distance greater than the low injection level lifetime diffusion length of said charge carriers, a P-conductivity type inducing impurity in said body providing therein a deep energy level spaced about midway between the upper edge of the valence band and the lower edge of the conduction band, said impurity having a concentration of about $10^{15}$ to $10^{17}$ atoms per cubic centimeter.

References Cited by the Examiner

UNITED STATES PATENTS

| | | | |
|---|---|---|---|
| 2,669,663 | 2/1954 | Pankove | 317—239 |
| 2,829,422 | 4/1958 | Fuller | 317—239 |
| 2,833,969 | 5/1958 | Christian | 317—239 |
| 2,860,218 | 11/1958 | Dunlap | 317—239 |
| 2,860,219 | 11/1958 | Taft et al. | 317—240 |
| 2,871,330 | 1/1959 | Collins | 317—240 |
| 2,871,377 | 1/1959 | Tyler et al. | 317—239 |
| 2,878,152 | 3/1959 | Runyon | 317—235 |
| 2,940,024 | 6/1960 | Kurshan | 317—239 |

OTHER REFERENCES

Physical Review Volume 125 No. 1 pages 126–141 January 1962, "Double Injection in Insulators," by Murray A. Lampert.

JOHN W. HUCKERT, *Primary Examiner.*

JAMES D. KALLAM, *Examiner.*

A. M. LESNIAK, *Assistant Examiner.*